United States Patent [19]
Hartleroad et al.

[11] 3,887,996
[45] June 10, 1975

[54] SEMICONDUCTOR LOADING APPARATUS FOR BONDING

[75] Inventors: Ronald J. Hartleroad, Twelve Mile; James P. Grabowski, Carmel, both of Ind.

[73] Assignee: General Motors Corporation, Detroit, Mich.

[22] Filed: May 1, 1974

[21] Appl. No.: 466,024

[52] U.S. Cl. .................. 29/583; 29/589; 29/471.1; 29/203 J; 29/203 P; 214/1 BB
[51] Int. Cl. .................. B01j 17/00
[58] Field of Search .......... 29/577, 589, 583, 576 S, 29/626, 471.1, 203 P, 203 J; 228/4, 5, 6; 214/1 BB

[56] References Cited

UNITED STATES PATENTS

| | | | |
|---|---|---|---|
| 3,341,030 | 9/1967 | Engels | 214/1 |
| 3,709,424 | 1/1973 | Drees | 29/589 |
| 3,722,072 | 3/1973 | Beyerlein | 29/589 |

OTHER PUBLICATIONS

"Transistor Inserting Machine," Merritt, IBM Technical Disclosure Bulletin, Vol. 2, No. 6, Apr. 1960, pp. 61 & 62.

*Primary Examiner*—W. Tupman
*Attorney, Agent, or Firm*—Robert J. Wallace

[57] ABSTRACT

A method and apparatus for automatically transferring and bonding integrally leaded semiconductor devices to conductive lead frame structures. An integrally leaded semiconductor chip affixed to a flexible carrier is positioned over an aperture in a slide member. The slide member is slidably mounted in a groove in one surface of a positioning device. A push rod presses the chip into the aperture in the slide member. The slide member is then moved in the groove to strip the chip from the carrier and automatically transfer it to an opening at the opposite end of the groove. A bonding probe extends through the opening to lift the chip up into alignment with an overlying lead frame structure for bonding.

6 Claims, 10 Drawing Figures

SEMICONDUCTOR LOADING APPARATUS FOR BONDING

BACKGROUND OF THE INVENTION

This invention relates to a method and apparatus for positioning integrally leaded semiconductor chips onto transfer probes for aligning the chips with a conductive lead frame structure for bonding. More particularly, it involves a distinctive positioning and transfer device and a method of using it to successively position integrally leaded semiconductor chips onto an alignment probe which raises the chip from the device into alignment with an overlying lead frame structure for bonding.

This invention is a production oriented improvement on U.S. Ser. No. 414,222, "Flip Chip Cartridge Loader," Hartleroad et al, filed Nov. 9, 1973, which is assigned to the same assignee of the present invention. In U.S. Ser. No. 414,222 there is disclosed a method and apparatus for positioning semiconductor flip chips onto one end of a probe of a magnetized transfer apparatus. The transfer apparatus is disclosed in U.S. Ser. No. 414,274, "Magnetic Alignment For Semiconductor Device Bonding," Hartleroad et al, filed Nov. 9, 1973, which is also assigned to the same assignee as this invention. In U.S. Ser. No. 414,222, a plurality of semiconductor flip chips are placed into one end of an elongated groove in a cartridge type positioning apparatus. The chips are shuttled longitudinally in the groove preferably by an air pressure source. Two spaced guide rails overlying the groove hold the chips in the groove and direct them towards an opening located at the opposite end of the groove. The probe then extends through the opening and engages the back side of the chip thereover. The probe carries the chip into close proximity with an overlying lead frame structure. A magnetic force transmitted through the probe automatically orients the flip chip contact bumps with the corresponding lead frame fingers and simultaneously raises the chip from the probe into precisely aligned engagement with the fingers for bonding. In the present invention we have further improved the concept and apparatus disclosed in U.S. Ser. No. 414,222 to additionally increase productivity in production.

OBJECTS AND SUMMARY OF THE INVENTION

Therefore, it is an object of this invention to provide an improved method and apparatus for positioning integrally leaded semiconductor device chips onto a transfer probe which carries the chip into engagement with an overlying lead frame structure for bonding thereto. It is a further object of this invention to provide a production oriented method and apparatus for rapidly and accurately positioning integrally leaded semiconductor device chips onto a transfer probe which magnetically aligns the chip with an overlying lead frame structure for bonding thereto so as to substantially increase production productivity.

These and other objects of this invention are accomplished by affixing at least one integrally leaded semiconductor chip to a flexible carrier strip so that the integrally leaded face of the chip adheres to one surface of the carrier strip. A distinctive positioning device is provided having an elongated groove in one surface of a base member. A slide member is slidably disposed in the groove and includes an aperture therein for receiving the semiconductor chip. The flexible carrier strip is held over the groove preferably by two distally spaced support members on either side of the groove. Retainment means on the support members are also provided to secure the ends of the carrier strip thereto. The semiconductor chip on the carrier strip is positioned over the aperture in the slide member. A push rod above the flexible carrier strip presses the semiconductor chip into an aperture in the slide member. While the push rod holds the chip in the aperture, the slide member is then moved longitudinally in the groove to strip the chip from the flexible carrier strip. Preferably, the slide member slides in the groove until it abuts a protrusion at one end of the groove. This abutment of the slide member automatically positions the chip over an opening in the groove which extends through the base member. An alignment probe extends through the opening to lift the chip up into engagement with an overlying lead frame structure for bonding. Preferably, the alignment probe is part of the apparatus disclosed in U.S. Ser. No. 414,274 so that the integral chip leads are automatically magnetically aligned with corresponding fingers of the lead frame structure. A hot gas source is then directed at the lead-finger engagement to pemanently bond the chip to the lead frame structure.

DESCRIPTION OF THE PREFERRED EMBODIMENT

Figure 1:
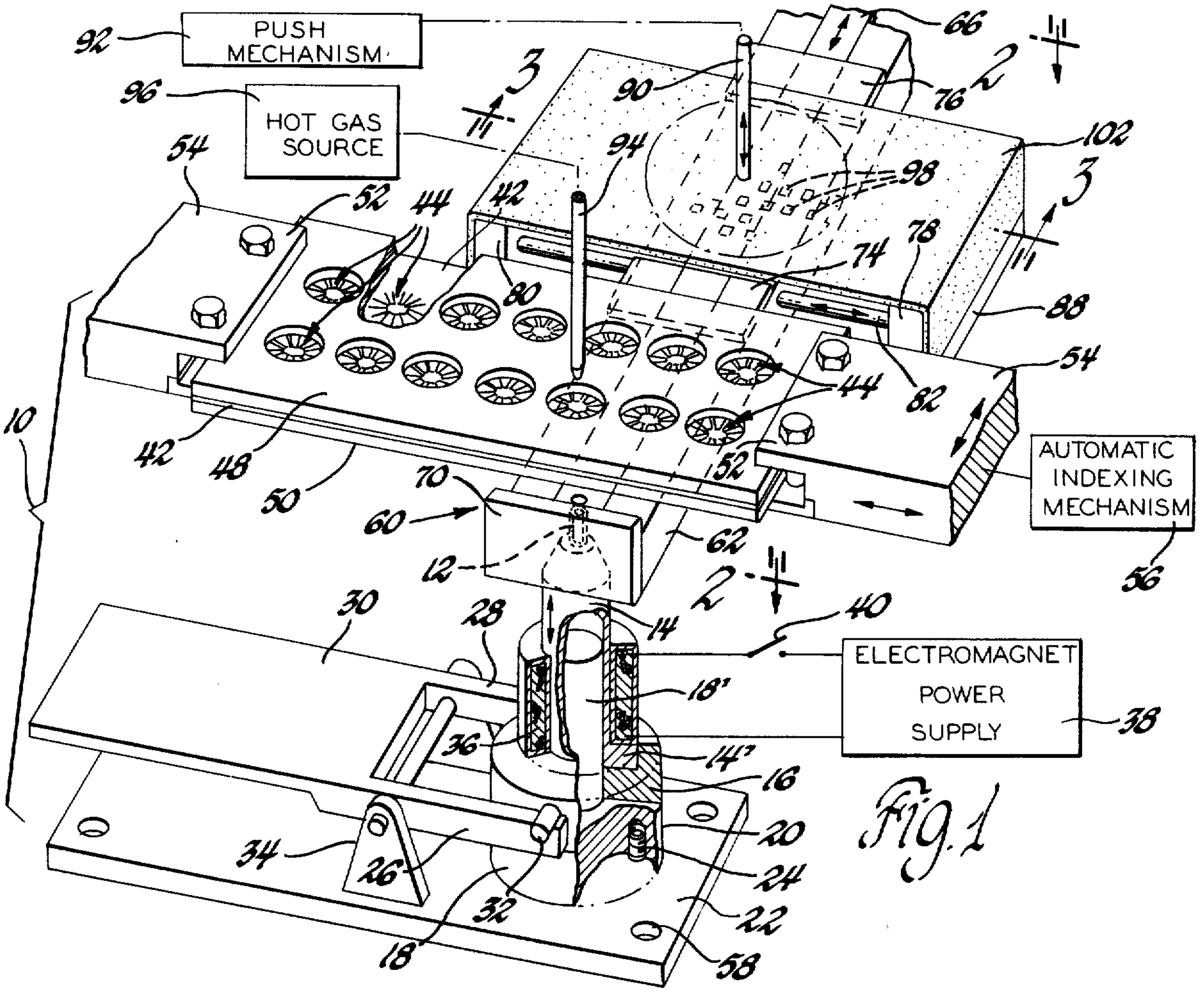
FIG. 1 shows an isometric view with parts broken away of the apparatus made in accordance with this invention.
Figure 2:
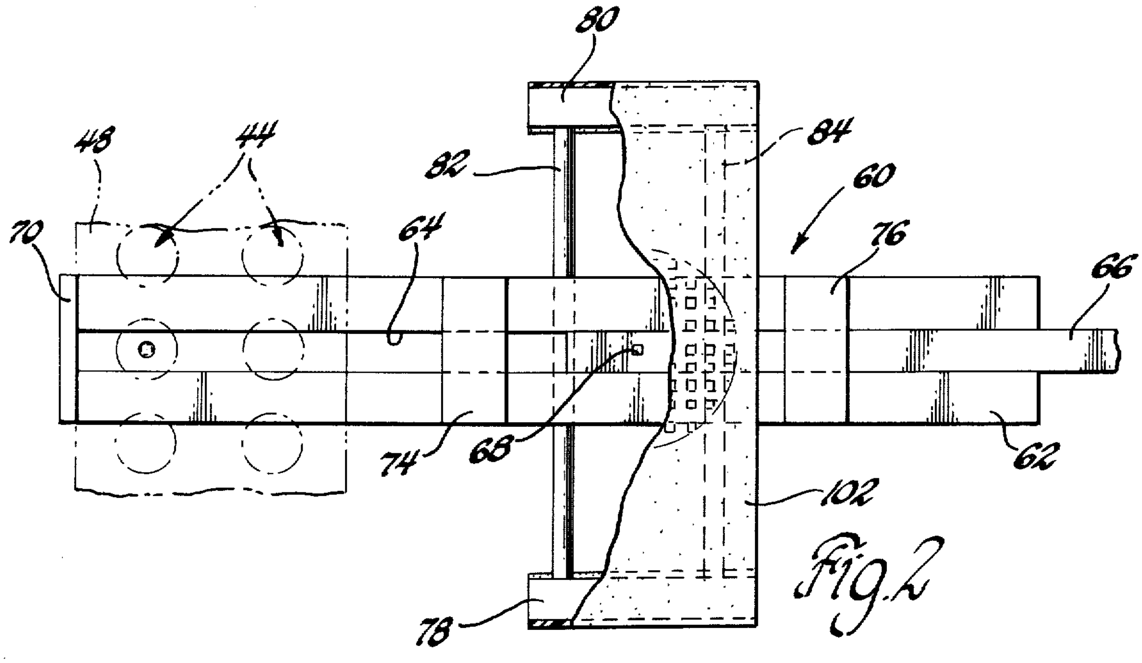
FIG. 2 shows a top plan view along lines 2—2 of FIG. 1.

The apparatus generally designated by reference numeral 10 is the same as that disclosed in U.S. Ser. No. 414,274, "Magnetic Alignment for Semiconductor Device Bonding," Hartleroad et al. This includes a soft ferromagnetic probe 12 extending vertically from the upper end of probe holder 14. Probe holder 14 has a flange portion 14' which is seated within a groove on an upper surface of an annular elevator base 16. The major longitudinal portion of probe holder 14 and elevator base 16 have a concentric longitudinal cylindrical opening to receive the cylindrical upper end 18' of base guide 18. The upper end 18' of base guide 18 extends into the longitudinal openings within the probe holder 14 and elevator base 16. The probe holder and elevator base are fitted around the base guide end 18' so that they slide easily vertically therealong without substantial horizontal deviation. Base guide 18 has a flange 20 at its lower end which is secured to the mounting plate 22 by screws 24. The assembly thus far described is located between the arms 26 and 28 of a yoke portion of lever 30. Elevator base 16 has two oppositely disposed and radially extending bosses 32 which rest on arms 26 and 28 of lever 30. Lever 30 is pivotally mounted on a fulcrum 34 which is attached to mounting plate 22. By pressing lever 30, probe 12 and the members of the transferred apparatus which are rigidly connected thereto are vertically raised while keeping horizontally aligned as they slide along the cylindrical base guide end portion 18'.

An electromagnetic coil 36 encircles the periphery of the probe holder 14. The coil 36 is about 1⅛ inch long and is constructed of number 38 gauge enameled copper wire 63 turns long and 10 turns deep. Coil 36 in conjunction with probe holder 12 forms an electromagnet. The electromagnet can be energized as is well known in the art by a typical DC power supply 38, which is series connected with the coil 36 and a switch 40. Preferably, in practicing this invention, the power supply should provide on the average of 15 volts and 0.45 ampere to the coil 36.

A conductive soft ferromagnetic gold plated lead frame structure 42 has a plurality of spaced apart sets 44 of mutually convergent cantilevered fingers 46. The fingers 46 have inner free ends 46' which correspond to the contact bump pattern on the semiconductor flip chip which will be later described. The lead frame in this example is constructed of alloy 42 which is an alloy containing by weight, about 41.5 percent nickel, 0.05 percent carbon, 0.5 percent manganese, 0.25 percent silicon, and the balance iron. Two identical cover plates 48 and 50 sandwich the lead frame 42 therebetween. The cover plates 48 and 50 and the lead frame 42 are held in mutual registration by means of clamps 52 on the end of arm 54 as can be seen in FIG. 1. The arms 54 are connected to a supporting automatic indexing mechanism 56 designated by the box in FIG. 1. The lead frame 42 is supported parallel to the mounting plate 22 which is secured to a flat, rigid surface (not shown), through mounting holes 58. The automatic indexing mechanism 56 moves the lead frame in a direction of the arrows of FIG. 1 to progressively position the sets 44 of lead frame fingers 46 over the alignment probe 12.

Located between alignment probe 12 and the overlying set of lead frame finges is positioning device 60 to which special attention is now directed. As can be seen in FIG. 1, the positioning device 60 is horizontally supportd transverse to the major longitudinal axis of the lead frame 42. The positioning device 60 can be so mounted by a suitable support (not shown) attached to the same surface as mounting plate 22. Preferably, the positioning device 60 is constructed of a nonferromagnetic material such as 300 series stainless steel so as not to disturb the magnetic flux concentration from the probe 12, as will later become more fully understood. The positioning device 60 includes a relatively thick elongated base member 62 having a rectangular cross-sectional area. There is a groove 64 in the top surface of the base member 62. The groove runs longitudinally throughout the length of the base member and is approximately 15 mils deep and one quarter inch wide. An elongated slide member 66 is slidably disposed within groove 64. The slide member 66 conforms to the configuration of the groove 64. Hence, the groove 64 provides a track for the slide member 66.

The slide member 66 has an aperture 68 which is centrally located in the slide member and is spaced a given distance from the end of the slide member. The aperture in this example is a 0.045 inch square for receiving a 0.038 inch square semiconductor chip. As will become more evident later in this description, the geometry of aperture 68 should conform to the geometry of the semiconductor chip to be placed therein.

A stop member 70 protrudes transversely across one end of the groove 64. In this example, stop member 70 can be secured to the corresponding end of base member 62 as by two screws (not shown) which extend into the one end of the base member 62. While in this example, stop member 70 is a discrete member, groove 64 may be terminated before it reaches the end of base member 62 thereby creating an integral stop therein.

A cylindrical opening 72 from the bottom portion of groove 64 through the base member 62. The opening 72 is centrally located in the groove 64 and is spaced from the stop member the same distance as the aperture 68 is spaced from the end of a slide member 66. As will become more apparent in the method description of this invention, the aperture 68 and opening 72 are so located so that the aperture 68 will be automatically located over the opening 72 upon abutment of the end of the slide member 66 against stop member 70. The opening 72 is slightly smaller than the width of aperture 68 and provides an opening so that probe 12 can extend therethrough.

Two retainer members 74 and 76 which cover the groove 64 ensure that the slide member 66 does not accidentally fall out of the groove 64.

Two distally spaced support members 78 and 80 parallel to groove 64 provide means for supporting a flexible semiconductor chip carrier. The support members are connected by two cylindrical rods 82 and 84. The rods are slidably disposed through said base member transverse and underneath the groove 64. Mounting brackets 86 and 88 each have two pin extensions 86' and 88' which extend into corresponding openings in support members 78 and 80 as can be seen most clearly in FIG. 3. A vertically suspended elongated cylindrical push rod 90 is attached to push mechanism 92 which is designated by the box in FIG. 1. The push rod 90 is centrally located over groove 64 in the positioning device 60 between the support members 78 and 80. The push mechanism 92 provides a downward force on the push rod 90. While this can be accomplished by mechanical means, it can also be accomplished manually. A hot gas bonding torch 94 above the lead frame 42 is directed towards a set 44 of lead frame fingers 46. The hot gas bonding torch 94 communicates with a source 96 which typically supplies a nitrogen and hydrogen gas mixture at a temperature of approximately 500°C.

According to the method of our invention, a plurality of semiconductor flip chips 98 are processed as part of a unitary wafer as known in semiconductor technology. A flip chip is in integrally leaded semiconductor device die in which the integral leads extend perpendicularly from a major chip face. These integral leads are often referred to as contact bumps which are extensions of a conductor pattern on the chip face and serve as electrical interconnection points for larger conductive leads. The flip chip 98 has a dozen spaced apart contact bumps 100 on its upper face equally spaced about its periphery. The flip chip 98 is approximately 38 mils square and 11–13 mils thick between its two major faces. The contact bumps are a composite of layers of aluminum, chromium, nickel, tin, and gold, with the outermost layer being gold to permit making a eutectic bond with the gold plated lead frame 42. While the foregoing bump construction is preferred, it can be varied. However, as more particularly described in U.S. Ser. No. 414,274, the nickel content should be at least about 30 percent by volume of a total contact bump volume in order to give the contact bump characteristics of a soft ferromagnetic material. By soft ferromagnetic material we mean a material having a high overall magnetic permeability and a low residual magnetization, with a low coercive field required.

The flip chips 98 are then separated and affixed to a flexible carrier strip 102. By affixed, we mean that the chips temporarily adhere to the carrier strip 102 and can be readily removed therefrom. In this example, grid lines are sawed or scribed partially through the front side of the wafer in the areas between the individual chips as is well known in semiconductor technology. The wafer is then placed front side down on a 4 mil thick polyethylene sheet. The sheet heated to about 400°F as by placing in on a hot plate. While the sheet is softened the wafer is lightly pressed into the sheet. The sheet with the wafer is removed from the hot plate to harden the sheet thereby affixing the wafer to it so that the contact bumps are partially buried in the sheet. The excess polyethylene sheet is then trimmed off leaving about ⅛ inch around the wafer.

The sheet is then pulled over rollers or over an edge of a table to break apart the wafer along the grid lines to separate the chips in spaced rows and columns. This process is known as "dicing" the wafer. Note that the chips are still affixed to the sheet.

After dicing, the sheet is placed on a second, much larger, transparent, flexible thermoplastic sheet. The second sheet may be Flex-O-Glass distributed by Warp Brothers and is about 8 inches square and 2 mils thick. The second sheet is placed on one surface of a hollow perforated disc having a plurality of small pin holes in the one surface thereof and a port extending from its side providing an inlet for ambient air. The disc with the sheets thereon is placed on a hot plate heated to about 400°F to soften the plastic sheets. While softened, the two sheets are lightly pressed together and smoothed so there are no air bubbles therebetween. A hollow tubular vacuum ring is placed on the second sheet to circumvent the wafer. The vacuum ring has an inwardly facing perforated wall and an outwardly extending port for attaching a vacuum source thereto. A cover is placed on top of the vacuum ring to enclose the wafer. While the sheets are still being heated, a vacuum of about 20 inches Hg. is created in the enclosed area by attaching a vacuum source to the ring. The vacuum sucks air up through the bottom disc which in turn pushes the sheets up against the cover to expand them. This vacuum formation separates each individual chip so that each chip is spaced about 1/32 of an inch from one another. The hot plate is then removed to cool the sheets in their expanded state. After they have cooled to room temperature the vacuum is removed. Upon cooling and hardening the two expanded sheets are thereby permanently bonded together to form one continuous flexible carrier strip 102 having a plurality of spaced flip chips 98 affixed thereto with their contact bumps 100 frictionally engaged to the carrier strip 102. Hence, by the above process the flip chips 98 are separated from the wafer and affixed to the flexible carrier strip 102 in spaced relation to other chips thereon as can be seen by reference to the drawings.

Figure 3:
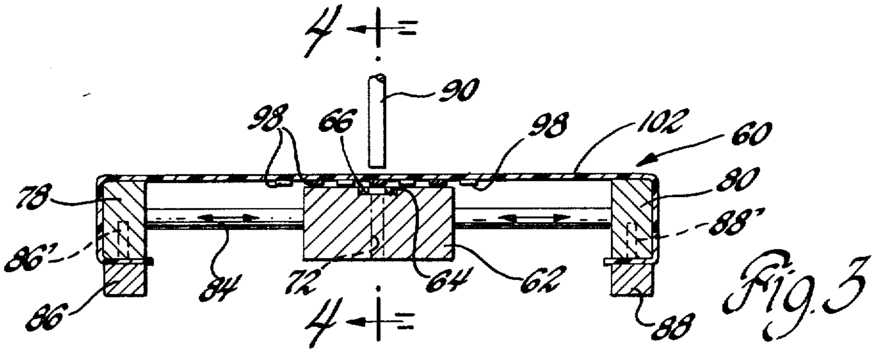
FIG. 3 shows a sectional view in partial elevation along the line of 3—3 of FIG. 1.

As can be seen most clearly in FIG. 3, the carrier strip 102 is stretched over the positioning device 60. The opposite ends of the carrier strip 102 are secured on the underside of the supporting members 78 and 80 by the mounting brackets 86 and 88. This is accomplished by pulling the mounting bracket out of the supporting members 78 and 80 and following the ends of the carrier strip 102 around and underneath the support members 78 and 80. While keeping the flexible carrier taut, the mounting brackets are then inserted into their respective support members. The pins 86' and 88' puncture the flexible carrier and secure the flexible carrier under tension as shown in FIG. 3. Flexible carrier 102 is mounted so that the flip chips 98 are between the carrier 102 and the grooved surface of the positioning device 60.

After the flexible carrier has been mounted, the slide member 66 is then translated so that the aperture 58 is aligned with a transversely extending column of flip chips 98. Once the aperture is positioned in alignment with a column of flip chips 98, the flexible carrier 102 can be moved by sliding the support members 78 and 80 until one flip chip is aligned with the aperture as can be seen in FIG. 4.

Figures 4, 5, 6, 7, 8, 9, 10:
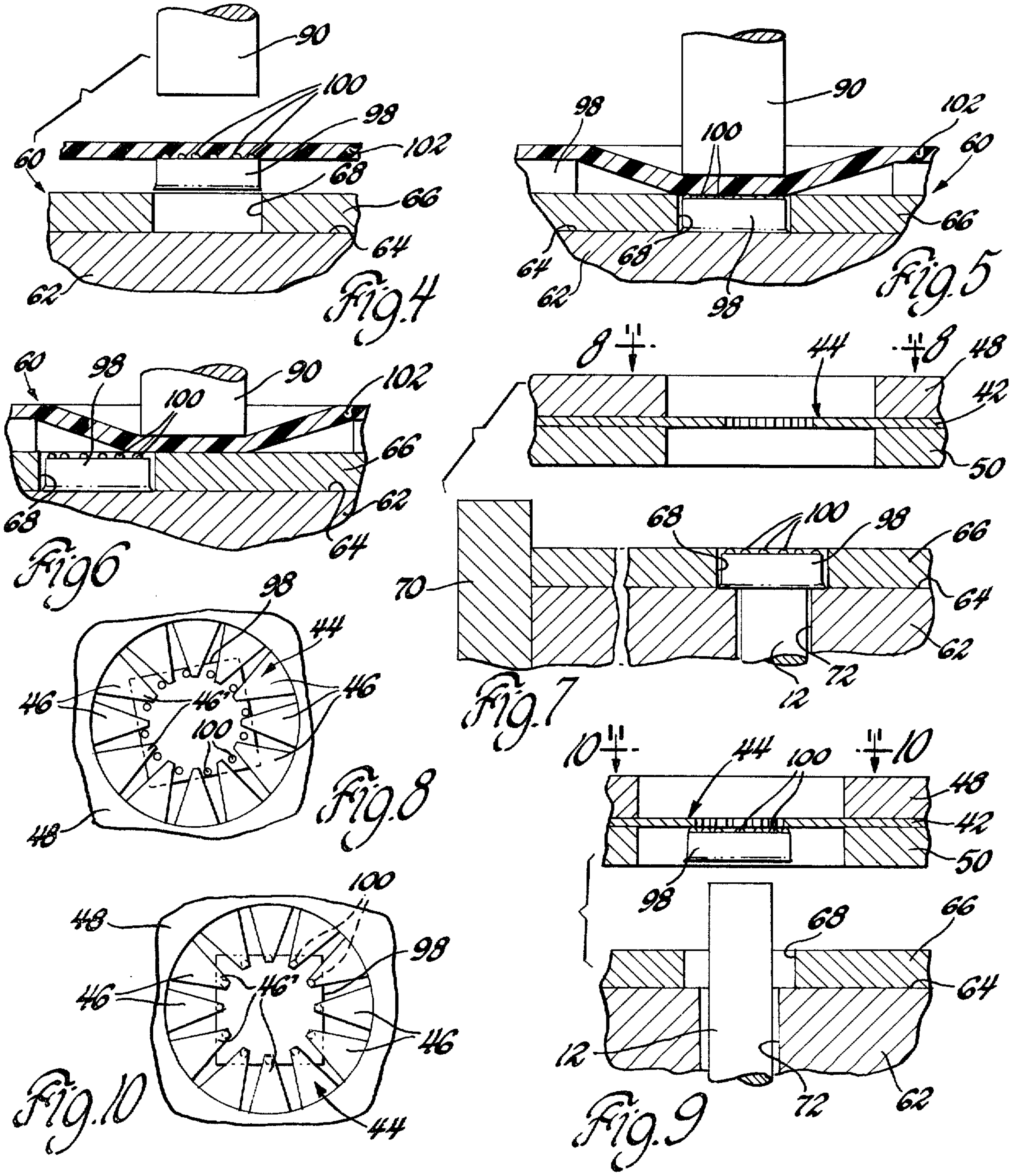
FIG. 4 shows an enlarged sectional view along lines 4—4 of FIG. 3.
FIG. 5 shows a view similar to that of FIG. 4 during a succeeding step of the method of this invention.
FIG. 6 shows a view similar to that of FIG. 5 during a succeeding step of the method of this invention.
FIG. 7 shows a sectional view in partial elevation with parts broken away of a succeeding step fo the method of this invention.
FIG. 8 shows a top plan view along the lines 8—8 of FIG. 7.
FIG. 9 shows a view similar to that of FIG. 7 during a succeeding step of the method of this invention.
FIG. 10 shows a top plan view along the lines 10—10 of FIG. 9.

Referring now to FIG. 5, the push rod 90 is then actuated to press the flip chip 98 into the apertures 68 until the bottom of the flip chip abuts the bottom of the groove 64. While the push rod 90 is still providing a downward force, the slide member 66 is then slid along the groove 64 to strip the flip chip 98 from the flexible carrier 102 as can be seen in FIG. 6. The slide member 66 slides along the groove 64 until the end of the slide member 66 abuts the stop member 70 as can be seen in FIG. 7. As can be seen, this automatically aligns the flip chip 98 over the opening 72 in the base member. The lead frame 42 has been previously positioned by the automatic indexing mechanism 56 so that a set 44 overlies the opening 72 in the positioning device 60. Hence the flip chip 98 is automatically brought into general alignment with the overlying lead frame finger set 44. However, the contact bumps 100 on the flip chips may be precisely aligned with their corresponding fingers 46, on the tolerances of the size of the chip 98 and the apertures 68. However, it does not matter if the contact bumps are not precisely aligned with their fingers when employing the automatic magnetic alignment system such as that described in the preferred embodiment of this invention.

After the flip chip 98 has been positioned over the opening 72, the electromagnet coil 36 is energized by closing switch 40. The lever 30 is then depressed to extend the probe 12 through the opening 72 of the positioning device 60. The probe engages the back side of the chip 98 which is located over the opening 72 and raises it into close proximity with the overlying lead frame fingers 46. When the flip chip 98 is brought close enough to the underside of the fingers, the magnetic force which is transmitted through the soft ferromagnetic probe 12 raises the chip the rest of the way to the underside of the fingers 44 as can be seen in FIGS. 9 and 10. In moving from the probe towards the fingers, the flip chip is also concurrently automatically oriented by magnetic flux lines concentrated in the lead frame fingers and the chip contact bumps, so that when the contact bumps 100 engage their respective fingers 46, they are precisely aligned therewith. This orientation can occur before or after the chip raises off the probe, but will always occur before the contact bumps engage their respective fingers.

Once the engagement is made between the contact bumps 100 and the fingers 46, they are permanently bonded together by a hot gas blast from bonding torch 94. The hot gas melts the tin in the contact bumps and the gold outer surfaces of the contact bumps 100. The gold outer surfaces of the contact bumps 100 and fingers 46 dissolve in the tin to form a melt. The hot gas is then removed and the melt resolidifies to form a permanent electrical and mechanical connection between the flip chip bumps 100 and the lead frame fingers 46.

This cycle can be repeated very rapidly so as to increase productivity rate in production. To repeat the cycle, the probe 12 is withdrawn from the opening 72 and the slide member 66 slid back into its original starting position. A new flip chip is then positioned over the aperture in the slide member by moving the support member 78 and 80 as hereinbefore described. The push rod 90 is then actuated to press a new chip into the aperture. The slide member is then translated down the groove to strip the new flip chip from the carrier strip 102. The slide member 66 slides along the groove until it again abuts stop member 70 to automatically position the new chip over the opening 72. A new set 44 of lead frame fingers 46 is then positioned by the automatic indexing mechanism 56 so that the set 44 overlies the opening 72 in the positioning device 60. The probe 12 then again extends through the opening and engages the chip thereover to align it with the overlying lead frame structure before bonding.

The distinctive positioning device 60 as described in connection with this preferred embodiment provides commercially feasible means for rapidly and accurately positioning integrally leaded semiconductor chips onto one end of a bonding probe. While in this preferred embodiment the chips were magnetically aligned and transferred to the lead frame structure, alignment can occur utilizing other techniques which employ a probe for aligning the integral chip leads with corresponding fingers of a lead frame structure. It should also be noted that the positioning device of this invention can be adapted to simultaneously position two chips over a multi-probe apparatus for alignment with the lead frame, such as that apparatus described in U.S. Ser. No. 414,521, "Air Biased Probe for Semiconductor Device Bonding," Hartleroad et al, which is assigned to the same assignee as the present invention. If such a multi-probe apparatus is used, another opening spaced from opening 72 will be introduced so that the other probe may extend through the base member. Similarly, a second aperture to aperture 68 will be provided in the slide member 66 so that the slide member will transfer two chips and simultaneously orient them over the openings in the base member.

It should also be noted that the flip chips can be affixed to other flexible carrier strips by various methods. For example, the chips can be separated from its processing wafer and then transferred to a strip with an adhesive coating. Hence, while this invention has been described in connection with certain specific examples thereof, no limitation is intended thereby except as defined in the appended claims.

We claim:

1. An apparatus for transferring and positioning integrally leaded semiconductor chips onto a probe for bonding to lead frame structures, said apparatus comprising:

a base member having a flat major surface;

an elongated groove in said surface of the base member;

an elongated slide member slidably disposed in said groove, said slide member having at least one aperture therethrough providing a cavity into which a semiconductor chip can be inserted;

means on said base member surface for retaining said slide member in the groove;

a flexible carrier having at least one integrally leaded semiconductor chip affixed thereto wherein the integral chip leads are contiguous said carrier;

means for supporting said flexible carrier so that said chip is positioned over said aperture in the slide member, said carrier being responsive to a downward pressure so as to insert said chip into said aperture;

an opening in said groove extending orthogonally from the groove through the base member so that a bonding probe may extend therethrough; and means for stopping translational movement of said slide member after it has stripped said chip from said carrier so that said chip is automatically positioned over said opening whereby said probe may engage the back side of the chip and raise it into aligned engagement with an overlying lead frame structure for bonding.

2. An apparatus for automatically rapidly transferring and positioning integrally leaded semiconductor chips onto a magnetic probe for bonding to lead frame structures, said apparatus comprising:

a non-ferromagnetic base member having two major parallel surfaces;

an elongated groove in one surface of the base member;

a non-ferromagnetic elongated slide member slidably disposed in said groove, said slide member having an aperture therethrough spaced a given distance from one end of said slide member, said aperture having a geometry similar and slightly larger than that of integrally leaded semiconductor chip thereby providing a cavity into which the chip can be inserted;

means on said one base member surface for retaining said slide member in the groove;

at least two rods slidably mounted in said base member underneath and perpendicular to said groove;

two distally spaced support members being connected to one another by said rods;

a transparent, flexible carrier strip having a plurality of spaced integrally leaded semiconductor chips affixed thereto wherein the integral chip leads are contiguous said carrier strip;

means for securing said flexible carrier strip onto said support members whereby each chip can be individually positioned over the aperture in the slide member by laterally moving the support members, said carrier strip being responsive to a downward pressure so as to insert one of said chips into said aperture;

a protrusion extending transversely across one end of said groove providing the surface for abutment of said one end of said slide member;

an opening in said groove at said given distance from the protrusion and being slightly smaller than said aperture, said opening extending orthogonally from the groove through the base member so that a bonding probe may extend through the opening to engage the back side of a semiconductor chip after the slide member has stripped the chip from said carrier strip and automatically transferred and positioned the chip over the opening by abutting said protrusion.

3. A system for automatically transferring and bonding integrally leaded semiconductor chips to conductive lead frame structures, said system comprising:

means for horizontally supporting a conductive lead frame having a plurality of sets of soft ferromagnetic spaced convergent cantilevered fingers;

means for magnetically transferring semiconductor chips having soft ferromagnetic integral leads on one face thereof to an overlying set of lead frame fingers for bonding thereto, said transfer means having a soft ferromagnetic probe extending vertically therefrom;

means for applying a magnetic field to said probe so that magnetic lines of flux are transmitted longitudinally therethrough, said magnetic field having a strength sufficient to raise a chip up from said probe into precisely aligned engagement with said lead frame fingers;

a device for automatically successively positioning a chip onto one end of said probe, said device having a base member with an elongated groove in one surface thereof, a slide member slidably disposed in said groove, said slide member having an aperture therein for receiving a semiconductor chip, an opening disposed at one end of said groove extending perpendicularly through said base member whereby said probe can extend therethrough, and means for stopping translational movement of said slide member so that said aperture is aligned with said opening thereby automatically positioning a chip for engagement by said probe;

a transparent flexible carrier strip having a plurality of spaced integrally leaded semiconductor chips affixed thereto;

means for supporting said carrier strip over said slide member so that said chips are located between the slide member and the carrier strip;

means for aligning one of said chips with said aperture in the slide member;

means for pushing said chip into the aperture wherein translation of said slide member strips the chip from the carrier strip and automatically transfers it over the opening so that said probe can engage the chip and carry it into close proximity with an overlying set of lead frame fingers; and means for bonding said chip to the lead frame fingers after the magnetic field has raised the chip up from said probe to automatically align and engage the integral chip leads with their corresponding fingers.

4. A method of automatically transferring and bonding integrally leaded semiconductor chips to conductive lead frame structures, said method comprising:

affixing an integrally leaded semiconductor device chip onto one surface of a flexible carrier strip so that the integral chip leads adhere to the strip;

positioning the carrier strip over an elongated slide member slidably disposed in a groove on one surface of a positioning device so that said chip is located between the slide member and the carrier strip;

aligning said chip with an aperture in the slide member;

pushing said chip into said aperture;

moving said slide member in the groove to strip the chip from the carrier strip and to transfer said chip over an opening extending perpendicularly from the groove through the base member of the positioning device;

extending an alignment probe through the opening to engage the back side of the chip thereover;

lifting said chip out of the slide member with the probe;

aligning the integral chip leads with overlying corresponding fingers of a lead frame structure; and bonding said chip to the lead frame structure.

5. A method of automatically transferring and bonding integrally leaded semiconductor chips to conductive lead frame structures, said method comprising:

affixing a semiconductor wafer having a plurality of integrally leaded chips therein onto a flexible carrier strip so that the integrally chip leads adhere to the strip;

dicing the wafer to separate each discrete chip;

holding said carrier strip above an elongated slide member slidably disposed in a groove on one surface of a positioning device so that said chips are located between said carrier strip and said slide member;

aligning one of said chips with an aperture in the slide member which is spaced a given distance from one end thereof;

pushing said chip into the aperture;

moving said slide member in the groove to strip said chip from the carrier strip;

abutting said one end of the slide member against a protrusion extending transversely across the groove thereby automatically transferring and aligning said chip with an opening extending perpendicularly from the groove through the positioning device;

extending an alignment probe through the opening in the positioning device to engage the back side of the chip thereover;

lifting said chip out of the slide member;

aligning the integral chip leads with overlying corresponding fingers of a lead frame structure; and flowing a hot gas onto the integral chip leads in engagement with the lead frame fingers to permanently bond the chip to the lead frame structure.

6. A method of automatically transferring and magnetically aligning integrally leaded semiconductor chips to conductive lead frame structures for bonding, said method comprising:

affixing a semiconductor wafer having a plurality of chips with soft ferromagnetic integral leads thereon onto a flexible carrier strip so that the integrally chip leads adhere to the strip;

dicing the wafer to separate each discrete chip;

expanding the flexible carrier strip to further separate each discrete chip from one another;

securing opposite ends of the carrier strip to support members translationally connected to a positioning device having a slide member slidably mounted in a groove on one surface thereof, thereby locating said chips between said slide member and said carrier strip;

aligning one of said chips with an aperture in the slide member which is spaced a given distance from one end thereof;

pushing said chip with a vertically extending rod into said aperture in the slide member;

moving said slide member in the groove to strip the one semiconductor chip from the carrier strip;

abutting said one end of the slide member against a protrusion extending transversely across the groove thereby automatically transferring and aligning said chip with an opening extending perpendicularly from the groove through the positioning device;

positioning a conductive lead frame structure having sets of soft ferromagnetic spaced fingers corresponding to said integral chip leads so that a finger set overlies the opening in the positioning device;

applying a magnetic field to a soft ferromagnetic probe so that magnetic lines of flux are transmitted longitudinally therethrough;

extending said probe through said opening to engage said back side of the chip thereover;

raising the chip with said probe to within close proximity of said lead frame fingers whereby the magnetic force from said probe raises said chip the rest of the way to the fingers and concurrently automatically orients the chip while in transit thereto so that the integral chip leads are in precise aligned engagement with their corresponding lead frame fingers; and heating said integral chip lead-finger engagement to permanently bond said chip to said lead frame.

* * * * *